(12) United States Patent
Nakatogawa et al.

(10) Patent No.: US 12,520,680 B2
(45) Date of Patent: Jan. 6, 2026

(54) ELECTRONIC APPARATUS AND DISPLAY DEVICE

(71) Applicant: Magnolia White Corporation, Tokyo (JP)

(72) Inventors: Hirondo Nakatogawa, Tokyo (JP); Yoshiro Aoki, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 587 days.

(21) Appl. No.: 17/886,617

(22) Filed: Aug. 12, 2022

(65) Prior Publication Data

US 2023/0053949 A1 Feb. 23, 2023

(30) Foreign Application Priority Data

Aug. 18, 2021 (JP) .................................. 2021-133361

(51) Int. Cl.
*H10K 59/131* (2023.01)
*G09G 3/00* (2006.01)
*G09G 3/3233* (2016.01)
*H10K 59/65* (2023.01)

(52) U.S. Cl.
CPC ........... *H10K 59/131* (2023.02); *G09G 3/007* (2013.01); *G09G 3/3233* (2013.01); *G09G 2300/0426* (2013.01); *G09G 2300/0819* (2013.01); *G09G 2300/0842* (2013.01); *G09G 2320/0257* (2013.01); *G09G 2330/021* (2013.01); *H10K 59/65* (2023.02)

(58) Field of Classification Search
CPC ...... H10K 59/131; H10K 59/65; G09G 3/007; G09G 3/3233; G09G 2300/0426; G09G 2300/0819; G09G 2300/0842; G09G 2320/0257; G09G 2330/021
See application file for complete search history.

(56) References Cited

U.S. PATENT DOCUMENTS

2006/0221092 A1  10/2006  Noguchi et al.
2012/0062447 A1* 3/2012  Tseng ................ G02F 1/133305
                                                          345/33
2020/0051964 A1* 2/2020  Jung ..................... H01L 25/167

FOREIGN PATENT DOCUMENTS

JP          2009-065498 A       3/2009

* cited by examiner

*Primary Examiner* — Jay C Kim
*Assistant Examiner* — Woo K Lee
(74) *Attorney, Agent, or Firm* — Michael Best & Friedrich LLP

(57) ABSTRACT

According to one embodiment, an electronic apparatus includes a display panel on which a plurality of pixels are arranged, and an image capturing element configured to receive light through the display panel. The display panel includes a line formed in an area overlapping with the image capturing element and connected to the pixels. The line is shaped to meander in a plan view.

6 Claims, 13 Drawing Sheets

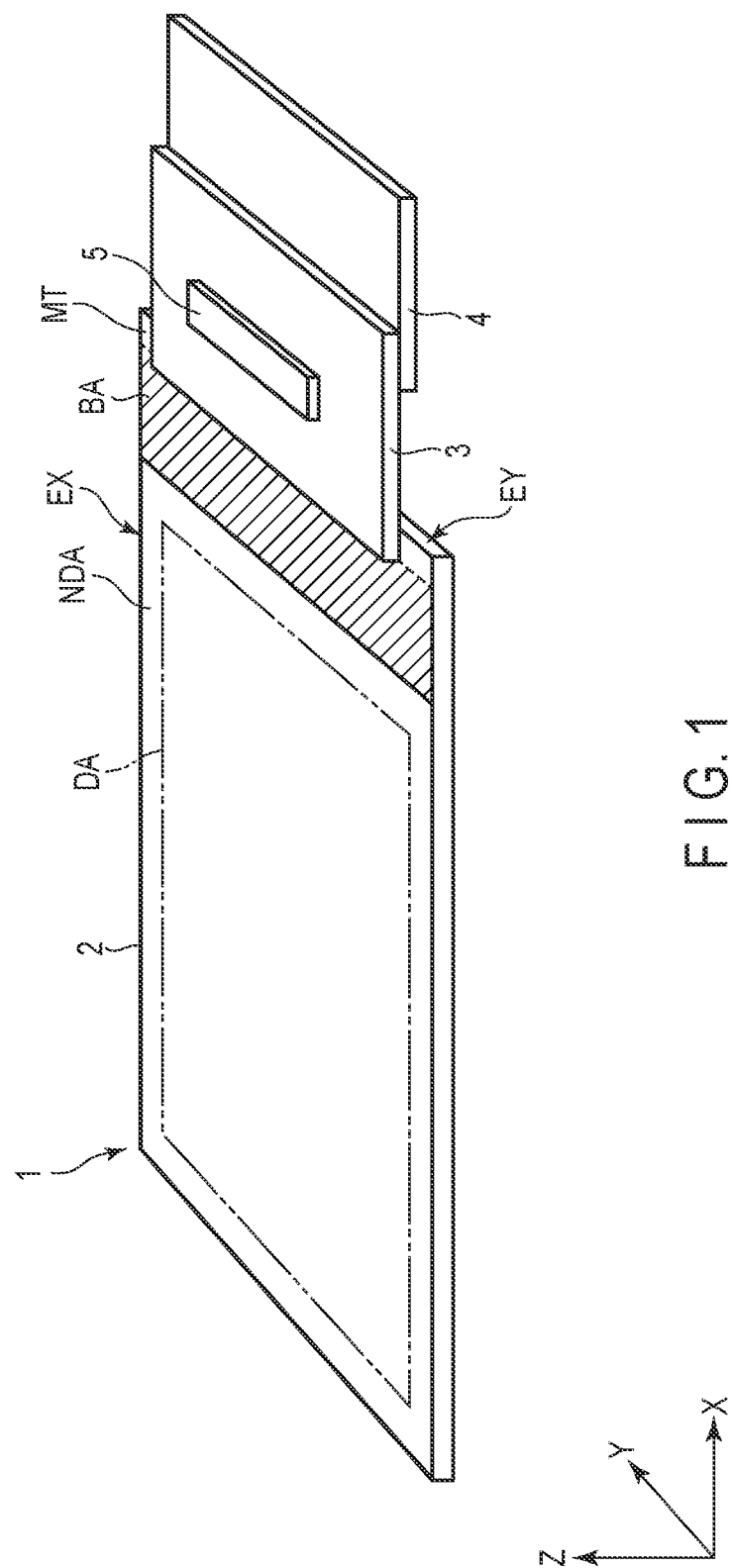
F I G. 1

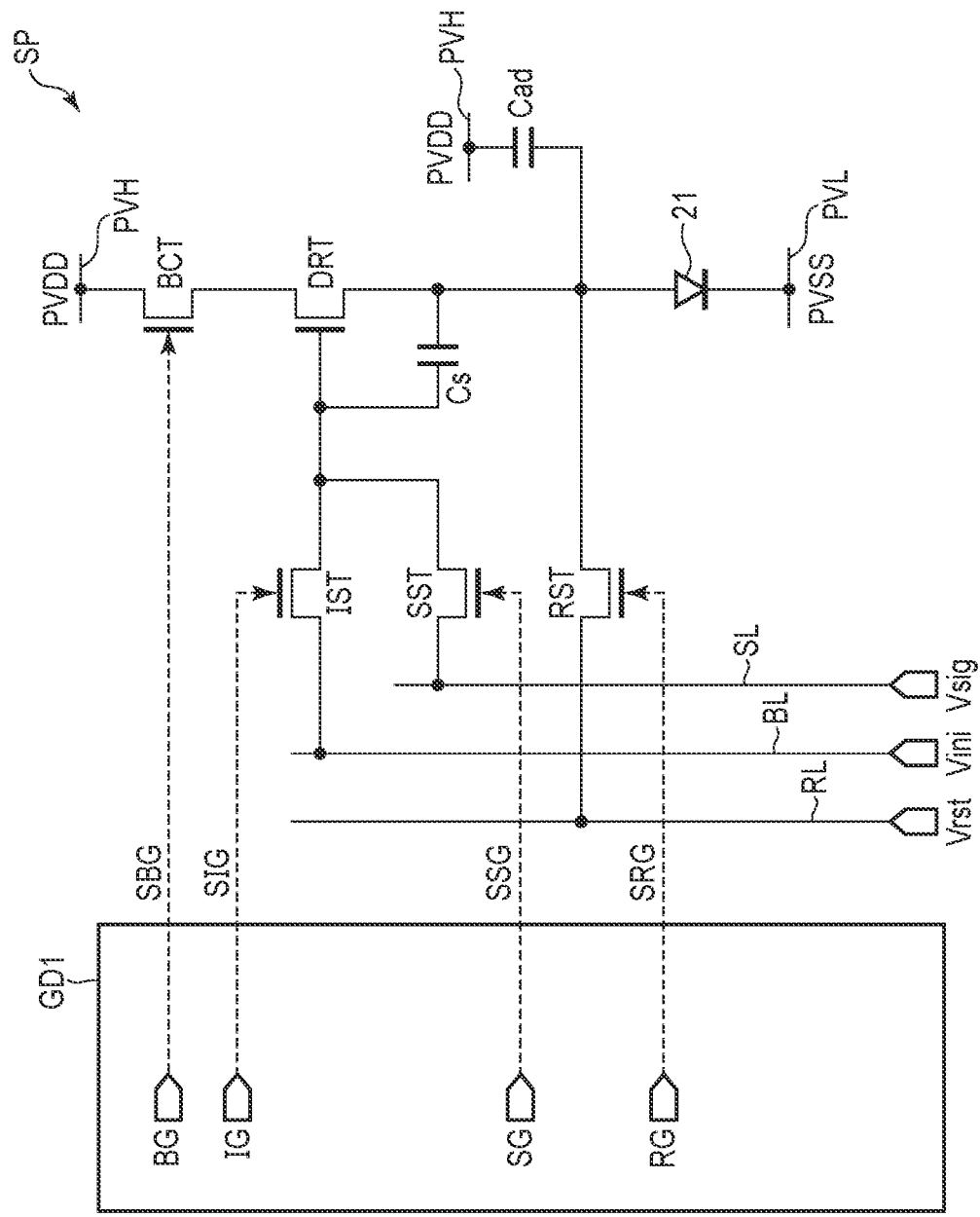
F I G. 4

ELECTRONIC APPARATUS AND DISPLAY DEVICE

CROSS-REFERENCE TO RELATED APPLICATIONS

This application is based upon and claims the benefit of priority from Japanese Patent Application No. 2021-133361, filed Aug. 18, 2021, the entire contents of which are incorporated herein by reference.

FIELD

Embodiments described herein relate generally to an electronic apparatus and a display device.

BACKGROUND

In recent years, electronic apparatuses such as smartphone, in which a display device and a camera are disposed on the same surface are widely available. Furthermore, as an example of display devices used in the electronic apparatus, there is a display device with organic electro luminescence (EL) elements (hereinafter will be referred to as organic EL display device).

In the aforementioned electronic apparatus, a camera may be arranged in a rear surface of the organic EL display device (display area) such that an image capturing element of the camera receives light through the organic EL display device in order to enlarge the display area even into an area overlapping with the camera.

However, in such a structure, quality of the image (image quality) captured by the camera (image capturing element) may be deteriorated.

BRIEF DESCRIPTION OF THE DRAWINGS

FIG. 1 is a schematic perspective view of the structure of a display device of an embodiment.
FIG. 4 is a circuit diagram of an example of a circuit structure of a subpixel.

DETAILED DESCRIPTION

Figure 2:
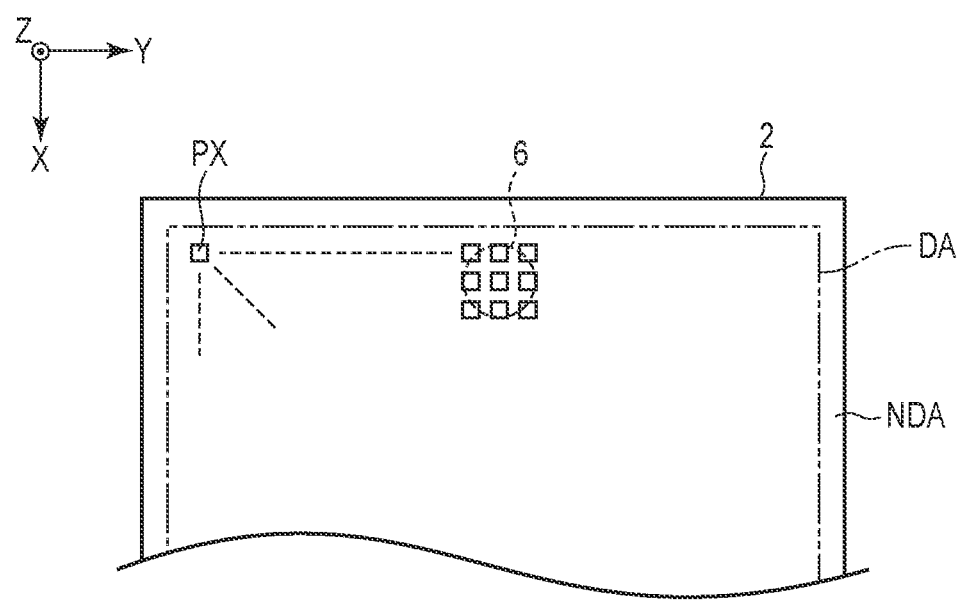
FIG. 2 is a plan view illustrating a part of an electronic apparatus in which a display device is incorporated.

In general, according to one embodiment, an electronic apparatus includes a display panel on which a plurality of pixels are arranged, and an image capturing element configured to receive light through the display panel. The display panel includes a line formed in an area overlapping with the image capturing element and connected to the pixels. The line is shaped to meander in a plan view.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

FIG. 1 is a perspective view schematically showing a configuration of a display device 1 according to this embodiment. FIG. 1 illustrates a three-dimensional space defined by a first direction X, a second direction Y perpendicular to the first direction X and a third direction Z perpendicular to the first direction X and the second direction Y. Note that the first direction X, the second direction Y and the third direction Z are orthogonal are orthogonal to each other, but may intersect at an angle other than ninety degrees. In the following descriptions, the third direction Z is defined as "upward" and a direction opposite to the third direction is defined as "downward". Further, with such expressions "a second member above a first member" and "a second member below a first member", the second member may be in contact with the first member or may be remote from the first member.

In the following, a case where a display device 1 is an organic EL display device having an organic electroluminescent (EL) element, which is a self-luminous element, will be described. The display device 1 of the present embodiment is used together with other devices such as a camera, and is incorporated into an electronic apparatus such as a smartphone.

As in FIG. 1, the display device 1 includes, for example, a display panel 2, first circuit board 3, and second circuit board 4.

The display panel 2 is rectangular in one example. In the example illustrated, the long side EX of the display panel 2 is parallel to the first direction X, and the short side EY is parallel to the second direction Y. The third direction Z corresponds to the thickness direction of the display panel 2. The main surface of the display panel 2 is parallel to the X-Y plane defined by the first direction X and the second direction Y. The display panel 2 includes a display area DA, non-display area NDA outside the display area DA, and terminal area MT. In the example illustrated, the non-display area NDA surrounds the display area DA. The terminal area MT is disposed along the short side EY of the display panel 2 and contains terminals for electrically connecting the display panel 2 to external devices, etc.

The first circuit board 3 is mounted on the terminal area MT and electrically connected to the display panel 2. The first circuit board 3 is, for example, a flexible printed circuit board. The first circuit board 3 includes, for example, a drive IC chip (drive circuit) 5 configured to drive the display panel 2 (display device 1). In the example illustrated, the drive IC chip 5 is located above the first circuit board 3, but may be located below. The second circuit board 4 is, for example, a flexible printed circuit board. The second circuit board 4 is connected to the first circuit board 3, for example, below the first circuit board 3.

The drive IC chip 5 is connected to the control substrate (not shown) via, for example, the second circuit board 4. The drive IC chip 5 controls display of images on the display panel 2 by emitting light from the organic EL element of the display panel 2 based on image data (pixel signals) output from the control substrate, for example.

The display panel 2 may include a bending area BA which is hatched in FIG. 1. The bending area BA is an area which is bent when the display device 1 is housed in the housing of the electronic apparatus. The bent area BA is located in the terminal area MT side of the non-display area NDA. While the bent area BA is bent, the first circuit board 3 and the second circuit board 4 are positioned below the display panel 2 to be opposed to the display panel 2.

FIG. 2 is a plan view of a part of the electronic apparatus in which the display device 1 of FIG. 1 is incorporated. As in FIG. 2, the display panel 2 of the display device 1 includes a plurality of pixels PX disposed (arranged) in a matrix in the first direction X and the second direction Y in the display area DA.

In the present embodiment, the pixel PX disposed in the display area DA includes an organic EL element and a pixel circuit for driving the organic EL element, as described below.

Here, in the present embodiment, the display panel 2 (display device 1) includes a display surface having the display area DA and a back surface opposed to the display surface, and a camera 6 including an image capturing element which receives light through the display panel 2 is disposed in the back surface side of the display panel 2. The camera 6 of the present embodiment is an imaging device (visible light camera) which captures a color image by receiving visible light through the image capturing element. Furthermore, in the present embodiment, the display device 1 and the camera 6 form an electronic apparatus such as a smart phone.

In the electronic apparatus of the present embodiment, the camera 6 is arranged in a position overlapping the display area DA. In other words, the camera 6 is arranged to span (that is, to overlap with) the pixels PX in a plan view. According to this configuration, the display area DA of the electronic apparatus (display device 1) can be expanded to the area overlapping the camera 6. In the present embodiment, a plan view means viewing the display device 1 (display panel 2) from the third direction Z.

Figure 3:
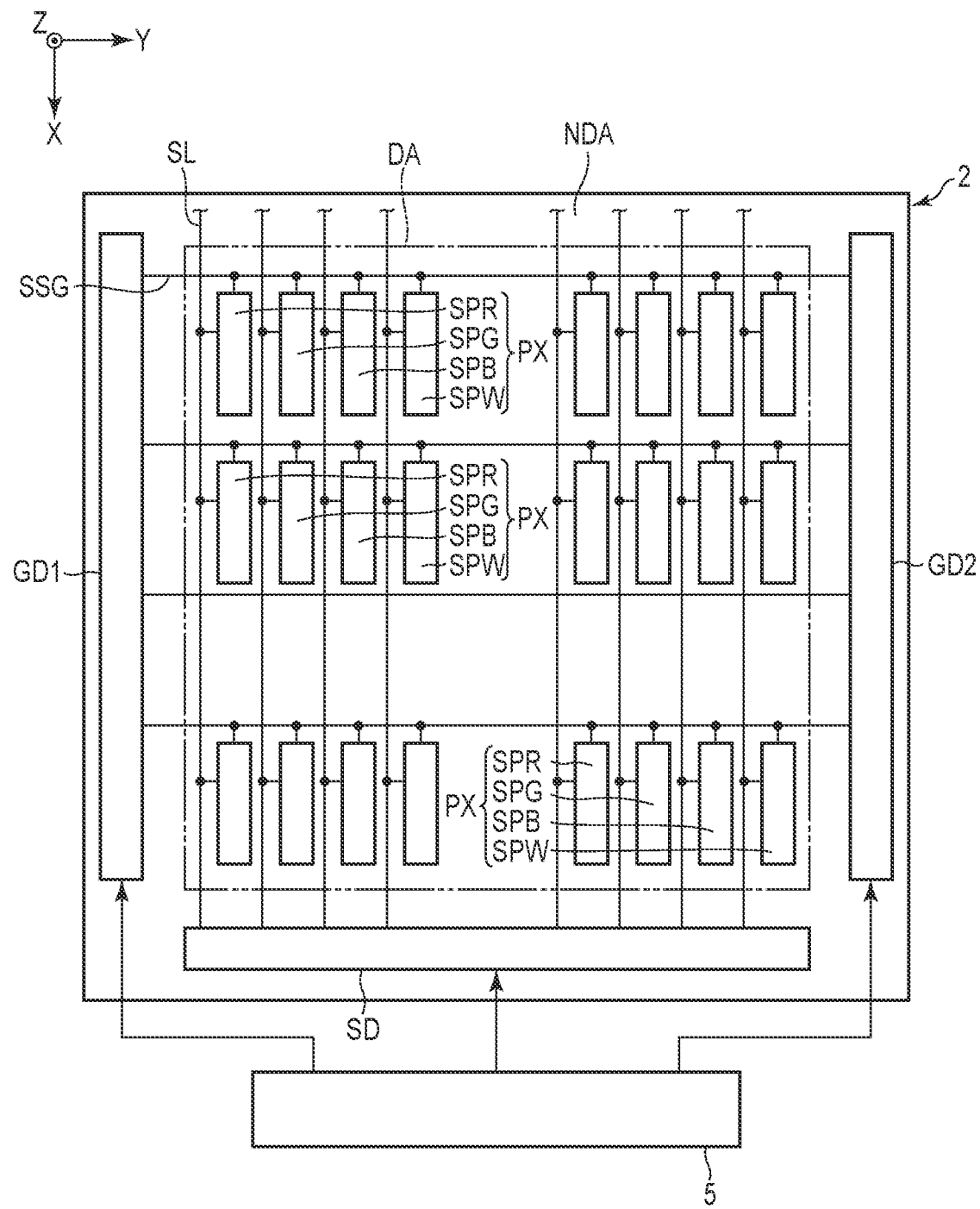
FIG. 3 illustrates an example of a circuit structure of a display panel.

FIG. 3 is a diagram illustrating an example of the circuit structure of the display panel 2. In the display panel 2, pixels PX, various lines, scan line drive circuits GD1 and GD2, and signal line drive circuit SD are disposed.

The pixels PX are arranged in a matrix in the display area DA as described above, and include a plurality of sub-pixels. In the present embodiment, the sub-pixels include sub-pixels SPR, SPG, SPB, and SPW. The sub-pixel SPR is a sub-pixel which displays (outputs) light corresponding to the red wavelength band (light of red component). The sub-pixel SPG is a sub-pixel which displays (outputs) light corresponding to the green wavelength band (light of green component). The sub-pixel SPB is a sub-pixel which displays (outputs) light corresponding to the blue wavelength band (light of blue component). The sub-pixel SPW is a sub-pixel which displays (outputs) light corresponding to the white wavelength band (light of white component).

The various lines described above extend in the display area DA and are drawn out to the non-display area NDA. In FIG. 3, a plurality of control lines (scan lines) SSG extending in the second direction Y and a plurality of pixel signal lines SL extending in the first direction X are shown as part of the various lines.

In the display area DA, the control line SSG and pixel signal line SL are connected to the sub-pixels SPR, SPG, SPB, and SPW. The control line SSG is connected to the scan line drive circuits GD1 and GD2 in the non-display area NDA. The pixel signal line SL is connected to the signal line drive circuit SD in non-display area NDA.

The scan line drive circuits GD1 and GD2 and the signal line drive circuit SD are positioned in the non-display area NDA. Various signals and voltages from the drive IC chip 5 are applied to the scan line drive circuits GD1 and GD2 and the signal line drive circuit SD.

Note that, in FIG. 3, the display panel 2 is shown with two scan line drive circuits GD1 and GD2, but the display panel 2 need only at least one scan line drive circuit.

Next, with reference to FIG. 4, an example of the circuit structure of a sub-pixel included in pixel PX will be described. In FIG. 4, the circuit structure of one sub-pixel SP among the multiple sub-pixels included in the pixel PX is shown for convenience.

As in FIG. 4, the sub-pixel SP includes an organic EL element 21 and a pixel circuit. The pixel circuit includes a drive transistor DRT, output transistor BCT, pixel transistor SST, initialization transistor IST, reset transistor RST, capacitance Cs, and auxiliary capacitance Cad.

Each transistor of FIG. 4 is, for example, an n-channel transistor. Note that the output transistor BCT, pixel transistor SST, initialization transistor IST, and reset transistor RST are not necessarily transistors, and may be configured to function as, for example, an output switch, pixel switch, initialization switch, and reset switch, respectively.

In the following description, one of the source and drain electrodes of the transistor will be referred to as first electrode and the other as second electrode. Furthermore, one electrode of the capacitive element will be referred to as first electrode and the other electrode as second electrode.

The drive transistor DRT and the organic EL element 21 are connected in series between first power supply line PVH and second power supply line PVL. The first power supply line PVH is held at a constant potential and the second power supply line PVL is held at a constant potential different from that of the first power supply line PVH. In the present embodiment, potential PVDD of the first power supply line PVH is higher than potential PVSS of the second power supply line PVL.

The first electrode of the drive transistor DRT is connected to an anode electrode of the organic EL element 21 (positive electrode), the first electrode of capacitance Cs, and the first electrode of auxiliary capacitance Cad. The second electrode of the drive transistor DRT is connected to the first electrode of the output transistor BCT. The drive transistor DRT is configured to control the current (current value) supplied to the organic EL element 21.

The second electrode of the output transistor BCT is connected to the first power line PVH. Furthermore, a cathode electrode (negative electrode) of the organic EL element 21 is connected to the second power supply line PVL.

The first electrode of the pixel transistor SST is connected to the gate electrode of the drive transistor DRT, the first electrode of the initialization transistor IST, and the second electrode of the capacitance Cs. The second electrode of the pixel transistor SST is connected to the pixel signal line SL. The second electrode of the initialization transistor IST is connected to the initialization power line BL.

The holding capacitance Cs is electrically connected between the gate electrode and the first electrode of the drive transistor DRT.

The second electrode of the auxiliary capacitance Cad is held at a constant potential. In the present embodiment, the second electrode of the auxiliary capacitance Cad is connected to, for example, the first power supply line PVH and is held at a constant potential (PVDD) equal to the potential of the first power supply line PVH. Note that, the second electrode of the auxiliary capacitor Cad may be held at the same constant potential (PVSS) as the potential of the second power supply line PVL, or may be held at the same potential of a power supply line which is different from the first and second power supply lines PVH and PVL. Note that, the power supply line which is different from the first and second power supply lines PVH and PVL is, for example, the initialization power supply line BL or the reset power supply line RL.

The first electrode of the reset transistor RST is connected to the first electrode of the drive transistor DRT. The second electrode of the reset transistor RST is connected to the reset power line RL.

The pixel signal Vsig is supplied to the pixel signal line SL. The pixel signal Vsig is the signal written to the pixel (in this example, sub-pixel SP). The initialization power supply line BL is supplied with the initialization potential Vini.

The reset power supply line RL is set to the reset power supply potential Vrst. The reset power supply potential Vrst is given as a potential with a potential difference such that the organic EL element 21 does not emit light relative to the potential PVSS of the second power supply line PVL.

The gate electrode of the output transistor BCT is connected to the control line SBG. The output control signal BG is supplied to the control line SBG.

The gate electrode of the pixel transistor SST is connected to the control line SSG. The pixel control signal SG is supplied to the control line SSG.

The gate electrode of the initialization transistor IST is connected to the control line SIG. The initialization control signal IG is supplied to the control line SIG.

The gate electrode of the reset transistor RST is connected to the control line SRG. The reset control signal RG is supplied to the control line SRG.

According to the circuit structure described above, the pixel transistor SST becomes conductive according to the pixel control signal SG supplied to the gate electrode via the control line SSG. As a result, the pixel signal Vsig supplied via the pixel signal line SL is supplied to the gate electrode of the drive transistor DRT via the pixel transistor SST, and is held in the capacitance Cs. The drive transistor DRT supplies a drive current of a current value according to the voltage value of the pixel signal Vsig held in the capacitance Cs to the organic EL element 21 in order to drive the organic EL element 21 and to allow the organic EL element 21 to emit light (driving the sub-pixels SP).

In this example, an outline of writing operation of pixel signal Vsig and light emitting operation of the organic EL element 21 in the display panel 2 has been explained briefly; however, according to the circuit structure described above, other operations (e.g., reset operation of drive transistor DRT and offset cancellation operation) can also be performed.

Furthermore, in this example, a circuit structure of one sub-pixel SP has been explained; however, the above sub-pixels SPR, SPG, SPB, and SPW have the same circuit structure as the sub-pixel SP of FIG. 4. That is, in the present embodiment, the organic EL elements 21 and the pixel circuit are arranged for each sub-pixel.

Note that, the circuit structure described with reference to FIG. 4 is an example, and the sub-pixels SPR, SPG, SPB, and SPW may have other circuit structures different from that of FIG. 4. That is, in the sub-pixels SPR, SPG, SPB, and SPW, for example, some of the circuit structure of FIG. 4 may be changed or omitted, or other structures may be added.

Incidentally, in the present embodiment, a camera 6 is arranged on the back surface of the display device 1 as described above, and the image capturing element of the camera 6 receives light through the display device 1 (display panel 2), and thus, an array substrate of the display device 1 (display panel 2), and the organic EL elements 21 and counter substrates of the pixels PX (sub-pixels SP) are light transmissive.

On the other hand, a plurality of lines connected to the pixels PX (sub-pixels SP) are formed on the array substrate (insulating substrate) of the display device 1 using, for example, a metallic material, and the light passing between the lines is irradiated onto the image capturing element. In that case, the quality of the image captured by the camera 6 (image capturing element) disposed on the back surface of the display device 1 may be deteriorated depending on the pattern of the lines connected to the sub-pixels SP (or pixel circuits thereof), that is, the line pattern on the array substrate.

Figure 5:
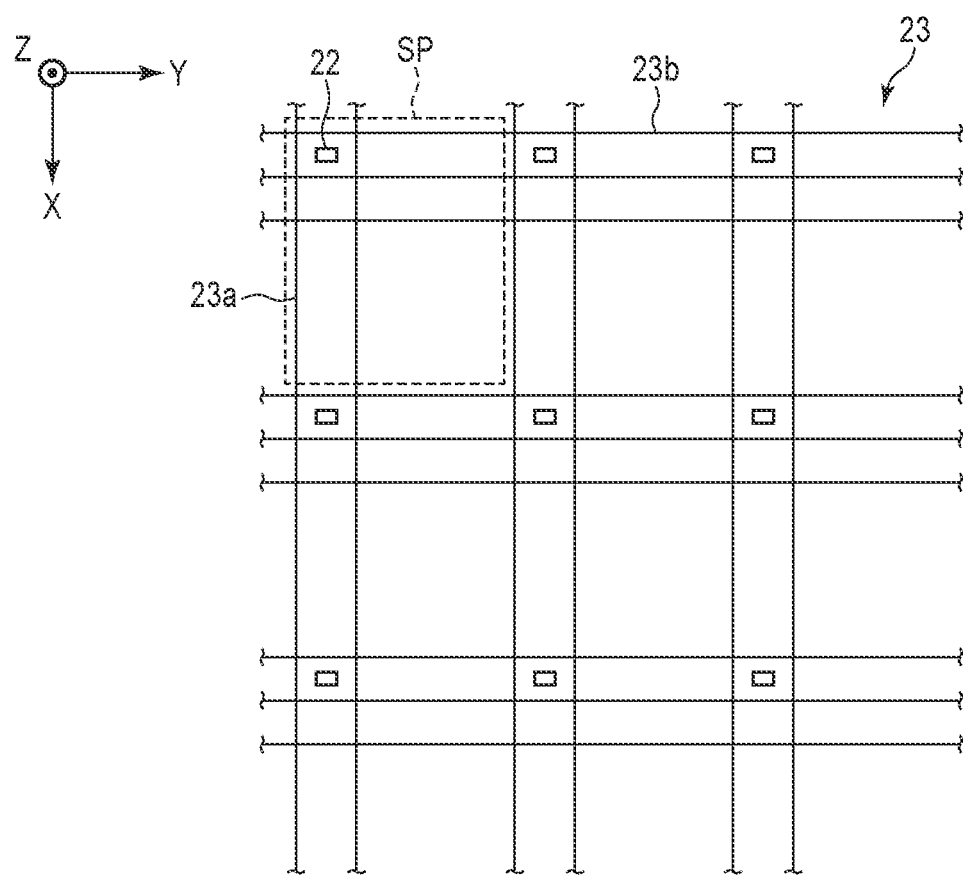
FIG. 5 illustrates how a line pattern on an array substrate influences quality of an image captured by a camera.

Referring to FIG. 5, how the line pattern on the array substrate affects the quality of the image captured by the camera 6 will be explained below. FIG. 5 illustrates an example of a pattern of line 23 connected to a sub-pixel SP as a comparative example of the present embodiment.

As in FIG. 5, the line 23 is connected to the pixel circuit 22 for driving the organic EL element 21 of each sub-pixel SP, and includes a first line 23a extending in the first direction X and a second line 23b extending in the second direction Y.

In FIG. 3 above, only pixel signal line SL is shown as a line extending in the first direction X (first line 23a); however, the first line 23a includes, for example, pixel signal line SL, first power supply line PVH, or second power supply line PVL as in FIG. 4. Furthermore, in FIG. 3, only control line SSG is shown as the line extending in the second direction Y (second line 23b); however, the second line 23b includes, for example, control lines SSG, SBG, SIG, and SRG, and initialization power supply line BL or reset power supply line RL as in FIG. 4.

In FIG. 5, a case where two first lines 23a and three second lines 23b are connected to one pixel circuit 22 (that is, one sub-pixel SP); however, the number of the first lines 23a and the second lines 23b may be different depending on, for example, the circuit structure of the pixel PX (sub-pixels SPR, SPG, SPB and SPW).

Here, the image capturing element of the camera 6 arranged on the back surface of the display device 1 is irradiated with light (e.g., visible light) passing through the above mentioned lines 23. If each of the 23 lines (line patterns on the array substrate) is formed in a straight line as in FIG. 5, the first lines 23a form slits arranged regularly at predetermined intervals.

Light passing through the slits formed by the first lines 23a extending in the first direction X is diffracted, and interference fringes are formed on the imaging surface of the image capturing element located below the slits (that is, the first lines 23*b*).

In that case, the camera 6 will capture images including interference fringes (ghosts) formed on the imaging surface, and the quality of the images captured by the camera 6 will be deteriorated.

Although the first line 23*a* is described here, the same phenomenon occurs with respect to light passing between the second lines 23 if they are formed in a straight line as in FIG. 5.

The interference fringes described above may be based on interference of light passing through a single slit among the slits formed by the first lines 23*a* or the second lines 23, or may be based on interference of light passing through a plurality of slits arranged at predetermined intervals.

Figure 6:
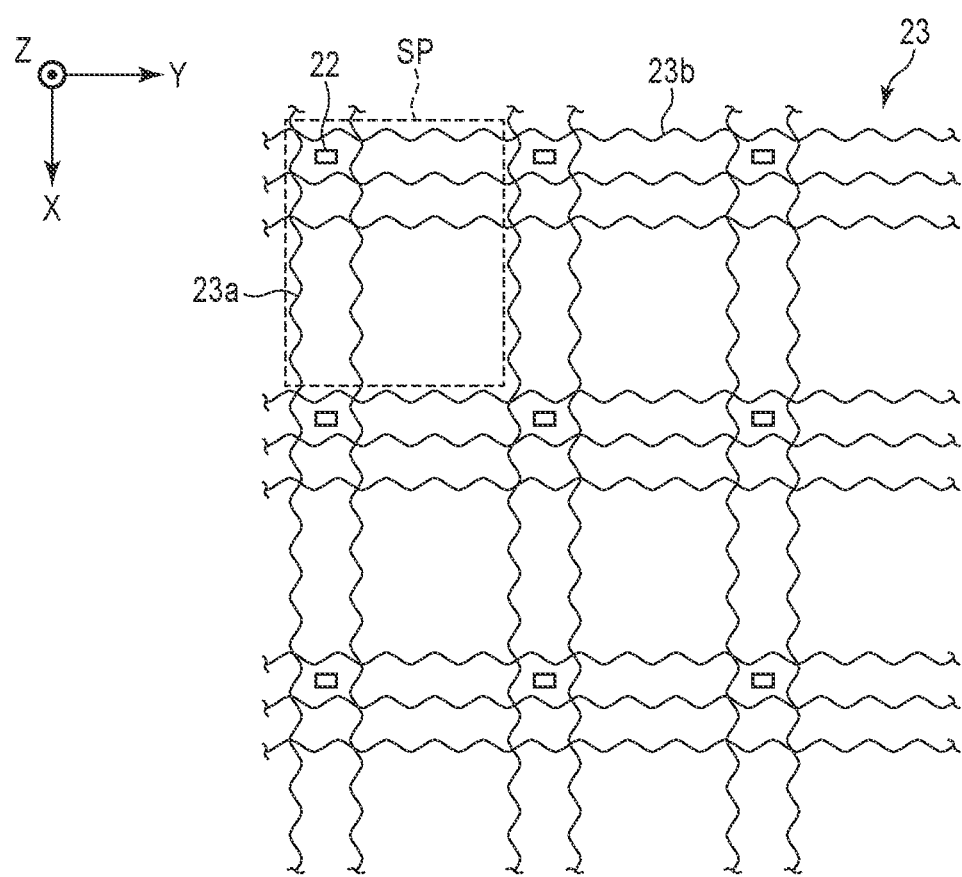
FIG. 6 illustrates an example of the line pattern of the embodiment.

Therefore, in the present embodiment, the metal lines 23 (first line 23*a* and second line 23*b*) are formed to have a curved shape in a plan view as in FIG. 6.

In the case where the line 23 has such a curved shape, compared to the case where the line 23 is formed in a straight line as described above, the direction (angle) of diffraction of light passing between the lines 23 (that is, slits) can be dispersed, and thus, interference fringes that affect the image captured by the camera 6 are not formed on the imaging surface.

As described above, in the present embodiment, it is possible to reduce the influence of interference fringes formed by the straight line pattern on the array substrate, and thus, the quality of the image captured by the camera 6 (image capturing element) arranged on the back surface of the display device 1 in which the lines 23 connected to the multiple pixels PX (sub-pixels SPR, SPG, SPB, and SPW) are formed can be suppressed.

Here, in the display area DA in which the pixels PX to which the line 23 is connected are arranged in the present embodiment, there are area overlapping with the camera 6 (image capturing element) and area not overlapping with the camera 6 in a plan view. However, for the area not overlapping with the camera 6, even if interference fringes are formed below the line pattern by the line pattern of the line 23, the image captured by the camera 6 is not affected. Therefore, the line 23 having the above-mentioned curved shape should be formed in the area overlapping with the camera 6. That is, the line 23 with a straight line shape may be formed in the area not overlapping with the camera 6.

In FIG. 6 above, the first line 23*a* (line extending in the first direction X) and the second line 23*b* (line extending in the second direction Y) included in the lines 23 are both curved. However, only one of the first line 23*a* and the second line 23*b* may be formed to have a curved shape. Even in such a structure, the effect of interference fringes on the image captured by the camera 6 can be reduced.

In the present embodiment, the line 23 is described as having a curved shape, but the line 23 may be partially formed as a straight line. Specifically, the line 23 may have, for example, a broken line shape (a shape in which intersecting line segments are aggregated) in a plan view. In other words, the line 23 in the present embodiment may have a meandering shape rather than a straight line at least in a plan view.

Figure 7:
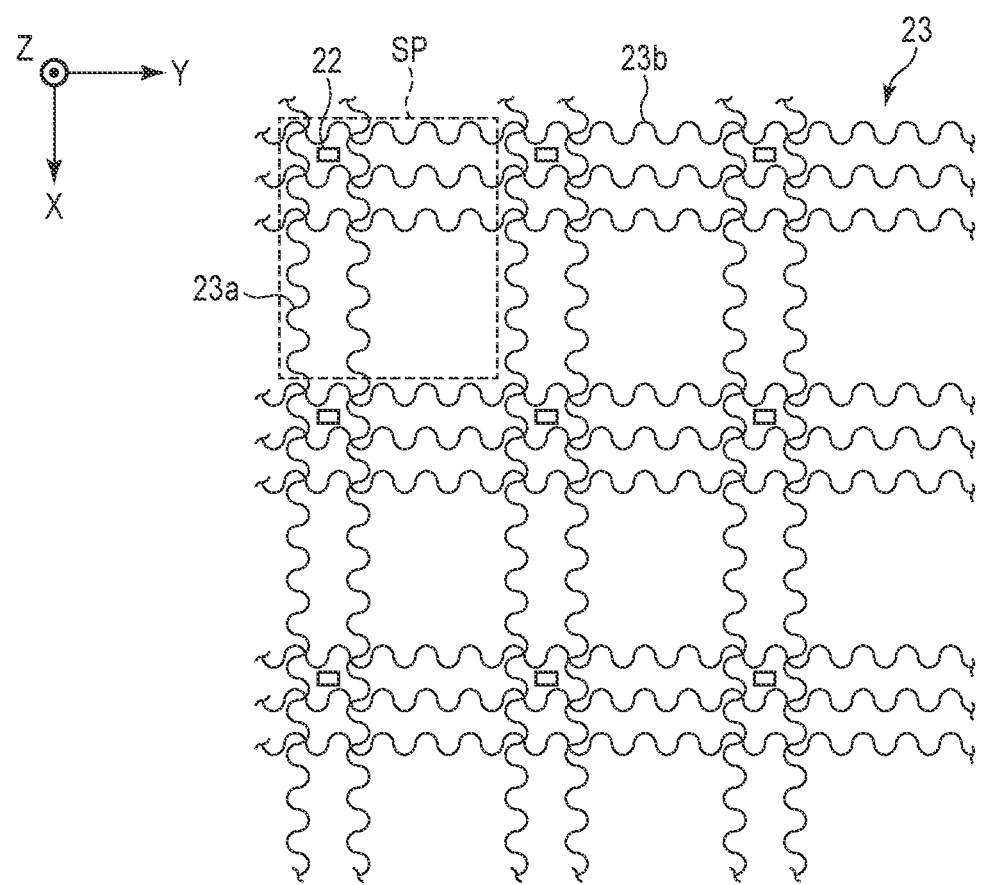
FIG. 7 illustrates another example of the line pattern of the embodiment.

In FIG. 6, the case in which the line 23 has a curved shape is described, but the line 23 (line pattern) may be formed to have, for example, a series of semi-circular arcs as in FIG. 7.

Figure 8:
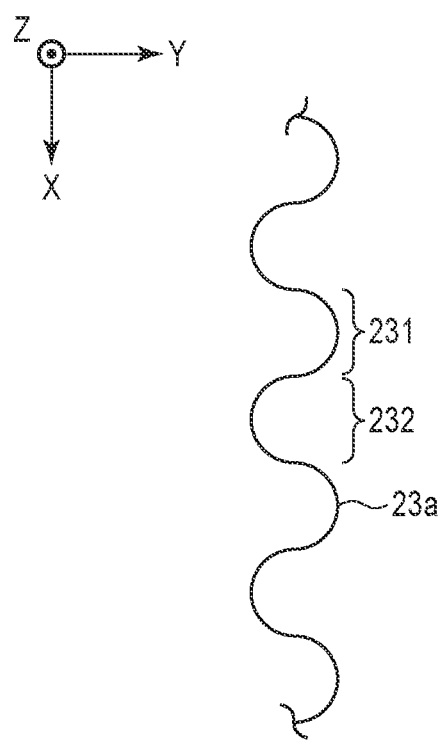
FIG. 8 specifically illustrates another example of the line pattern of the embodiment.

FIG. 8 is a diagram illustrating a portion of the first line 23*a* of FIG. 7 in an enlarged manner. As in FIG. 8, the first line 23*a* is shaped such that a first semicircular part 231 with a semicircular shape and a second semicircular part 232 with a semicircular shape which is axisymmetry with respect to the semicircular shape of the first semicircular part 231 are continuously connected (substantially S-shape). In other words, in the example of FIG. 8, the first semicircular part 231 and the second semicircular part 232 are formed so that the tops of the semicircular shapes are opposed to each other (that is, the direction of the convexity parts is opposite).

In this example, the first line 23*a* has been described, but the second line 23*b* is formed in the similar manner.

According to the line 23 with connected arcs as in FIGS. 7 and 8, the diffracted light can be dispersed in various directions as compared to the line 23 which is simply formed in a sinusoidal shape as described above, and the influence of interference fringes on the image captured by the camera 6 can be reduced.

Furthermore, in the present embodiment, the number of, for example, the first lines 23*a* in one sub-pixel SP and the number of inflection points of each of the first line 23*a* may be configured to match. Note that, the inflection points are points where the curved line changes the direction thereof in a plan view, and in the above example of FIG. 8, the connection points of the first semicircular part 231 and the second semicircular part 232 correspond to the inflection points.

Figure 9:
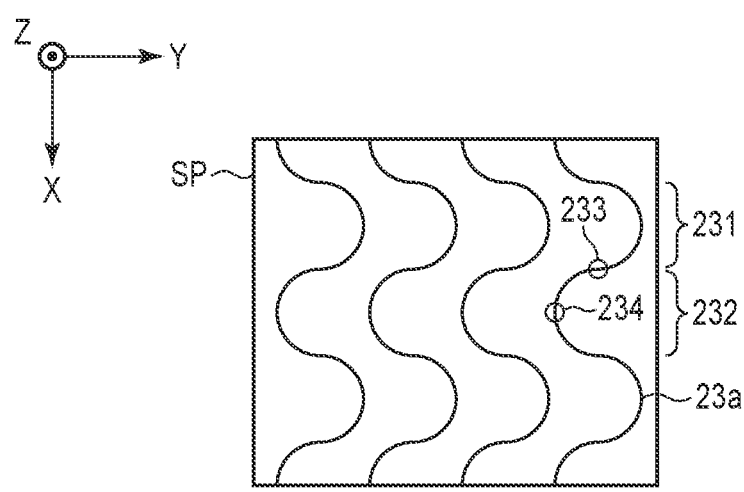
FIG. 9 further specifically illustrates another example of the line pattern of the embodiment.

FIG. 9 schematically illustrates an example where four first lines 23*a* are connected to the sub-pixel SP (the pixel circuit 22 thereof). In this case, the first line 23*a* formed in the area occupied by the sub-pixel SP (i.e., the area overlapping with the sub-pixel SP) is formed such that the connection points (inflection points) 233 between the first semicircular part 231 and the second semicircular part 232 becomes four.

In the present embodiment, "the area occupied by the sub-pixel SP" refers to the area where the organic EL element 21 and the pixel circuit 22 of the sub-pixel SP are arranged (formed) in a plan view, and the inflection point (connection point) 233 of FIG. 9 may be formed between, for example, the control line SSG (second line 23*b*), which is connected to the sub-pixel SP of FIG. 9 and the control line SSG (second line 23*b*) connected to the other sub-pixel SP adjacent to the sub-pixel SP in the first direction X.

Here, if the number of inflection points 233 of the first line 23*a* in the sub-pixel SP is greater than the number of the first line 23*a* connected to the sub-pixel SP, then the number of semicircular shape parts (i.e., first semicircular part 231 and second semicircular parts 232) in the relevant sub-pixel SP will increase. In that case, for example, the number of slits formed by the inflection points 233 aligned in the first direction becomes larger.

On the other hand, if the number of inflection points 233 of the first line 23*a* in the sub-pixel SP is less than the number of the first line 23*a* connected to the sub-pixel SP, the portion of the semicircular shape in the sub-pixel SP will be less. In this case, as compared to a case where the number of the inflection points 233 of the first line 23*a* in the sub-pixel SP described above is larger than the number of the first line 23*a* connected to the sub-pixel SP, the number of slits formed by the inflection points 233 adjacent in the first direction X becomes less, and thus, the number of slits formed in the tops 234 of the semicircular shapes adjacent to the second direction Y becomes relatively larger.

From the viewpoint of suppressing the deterioration of the quality of the image captured by the camera 6 (image capturing element), the interference fringes produced by the slits formed by the inflection points 233 adjacent in the first direction X and the interference fringes formed by the tops 234 of the semicircular shapes adjacent in the second direction Y are, preferably, distributed in a balanced manner. Thus, as described above, the number of the first lines 23a in the sub-pixel SP and the number of inflection points 233 in each of the first lines 23a are configured to match. According to the above configuration, the number of slits formed by the inflection points 233 adjacent to the first direction X and the number of slits formed by the tops 234 of the semicircular shape adjacent to the second direction Y become substantially the same, and the effect of the interference fringes on the image captured by the camera 6 can be made uniform.

Although the first line 23a has been mainly described here, the second line 23b may be formed in the same manner as the first line 23a described above in FIG. 9.

In the present embodiment, as in FIG. 7, it has been explained that the pixel circuits 22 are arranged at the same position in the area occupied by the sub-pixel SP. In such a structure, for example, a slit is formed by two pixel circuits 22 adjacent to each other in the second direction Y, and interference patterns formed by light passing through the slit (diffracted light) may affect the image captured by the camera 6.

Therefore, in the present embodiment, the position where the pixel circuit 22 is arranged may be changed for each sub-pixel SP.

Figure 10:
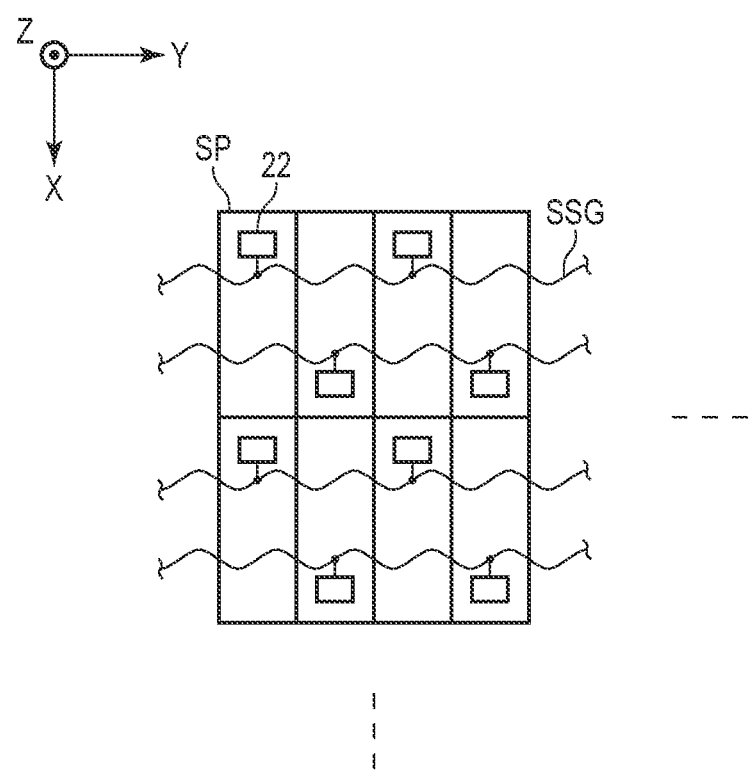
FIG. 10 schematically illustrates a positional relationship between a subpixel and a pixel circuit of the subpixel.

FIG. 10 schematically illustrates a positional relationship between each sub-pixel SP and the pixel circuit 22 of the sub-pixel SP.

In the example of FIG. 10, the pixel circuits 22 of each of the two sub-pixels SP adjacent to each other in the second direction Y can be positioned to be shifted in the first direction X by, for example, being configured to be connected to different control lines SSG (second lines 23b). That is, the pixel circuits 22 of each of the two sub-pixels SP adjacent to each other in the second direction Y are not arranged on the same straight line along the second direction Y.

With the above structure, compared to a case where the pixel circuits 22 of each of the two sub-pixels SP adjacent to each other in the second direction Y are aligned on the same line along the second direction Y as in FIG. 7 (that is, they are arranged adjacent to each other), it is considered that the effect of interference fringes formed by the light passing between the pixel circuits 22 can be reduced.

Furthermore, in the structure of FIG. 10, the pixel circuit 22 of one of the two sub-pixel SP adjacent to each other in the second direction Y may be arranged such that the pixel circuit 22 of the other sub-pixel SP is rotated.

Note that, the arrangement of the pixel circuits 22 of FIG. 10 is an example, and in the present embodiment, for example, at least a part of the pixel circuits 22 of each of the sub-pixels SP arranged along the second direction Y may be structured such that the part is not arranged with the other pixel circuits 22 on the same straight line along the second direction Y. In other words, the present embodiment is sufficient if the pixel circuits 22 of each of the sub-pixels SP are arranged to avoid being adjacent to each other such that the number of slits that cause interference fringes can be reduced.

In the above described embodiment, for example, the sub-pixel SPR has been described to have an organic EL element 21 which emits red light. However, the sub-pixel SPR may be configured to have, for example, an organic EL element 21 emitting white light and a color filter colored red disposed in a position opposed to the organic EL element 21. The same applies to sub-pixels SPG and SPB. That is, the present embodiment may be applied to a display device 1 (organic EL display device) using a color filter and an electronic apparatus equipped with the display device 1.

Furthermore, in the present embodiment, the pixel PX has been described to include sub-pixels SPR, SPG, SPB, and SPW; however, the present embodiment may be applied to a structure in which the pixel PX includes sub-pixels SPR, SPG, and SPB.

FIGS. 11 to 14 illustrate other examples of the first line 23a and second line 23b in the sub-pixel SP.

Figure 11:
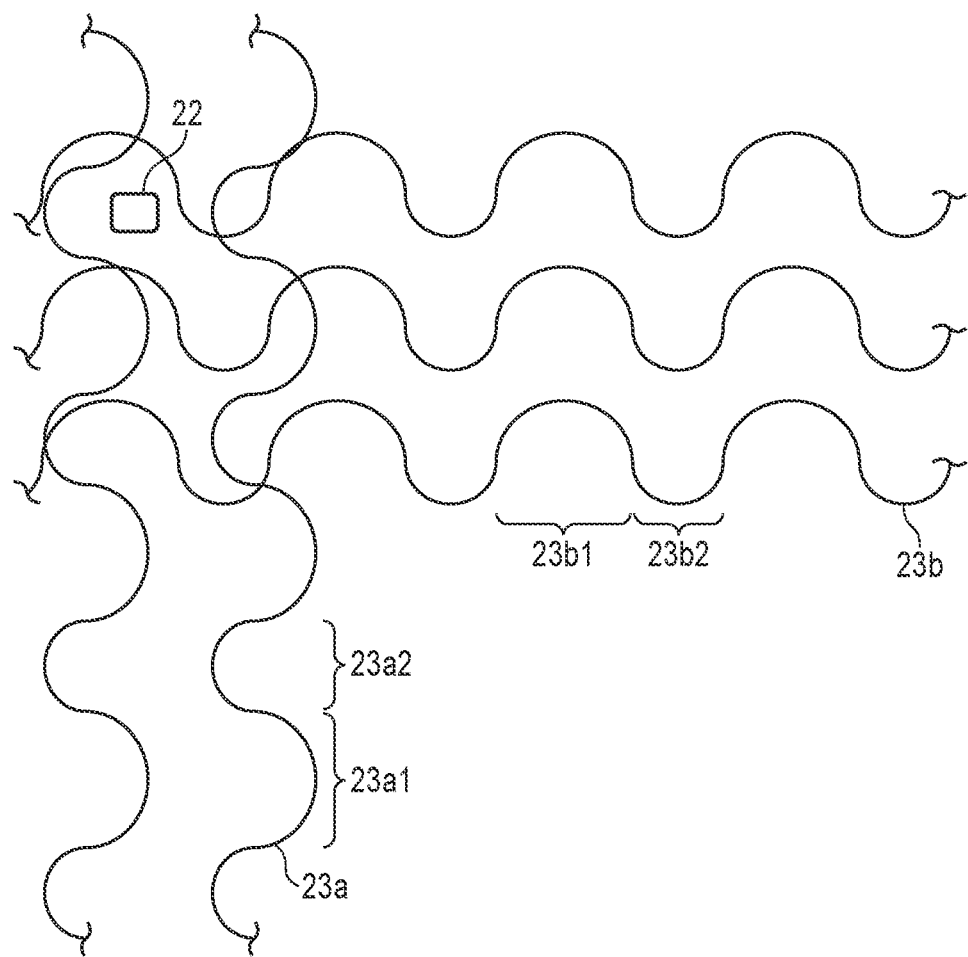
FIG. 11 illustrates another example of first and second lines of a subpixel.

FIG. 11 is a schematic view of first line 23a and second line 23b of a sub-pixel SP, in which the first line 23a and the second line 23b are composed of arcs with two different radii of curvature.

The first line 23a includes a first semicircular part 23a1 with a first radius of curvature and a second semicircular part 23a2 with a second radius of curvature, which are directly continuous. Furthermore, the first semicircular part 23a1 and the second semicircular part 23a2 are arranged alternately. The first radius of curvature is larger than the second radius of curvature.

The second line 23b includes a third semicircular part 23b1 with a third radius of curvature and a fourth semicircular part 23b2 with a fourth radius of curvature, which are directly continuous. The third semicircular part 23b1 and the fourth semicircular part 23b2 are arranged alternately. The third radius of curvature is greater than the fourth radius of curvature.

Figure 12:
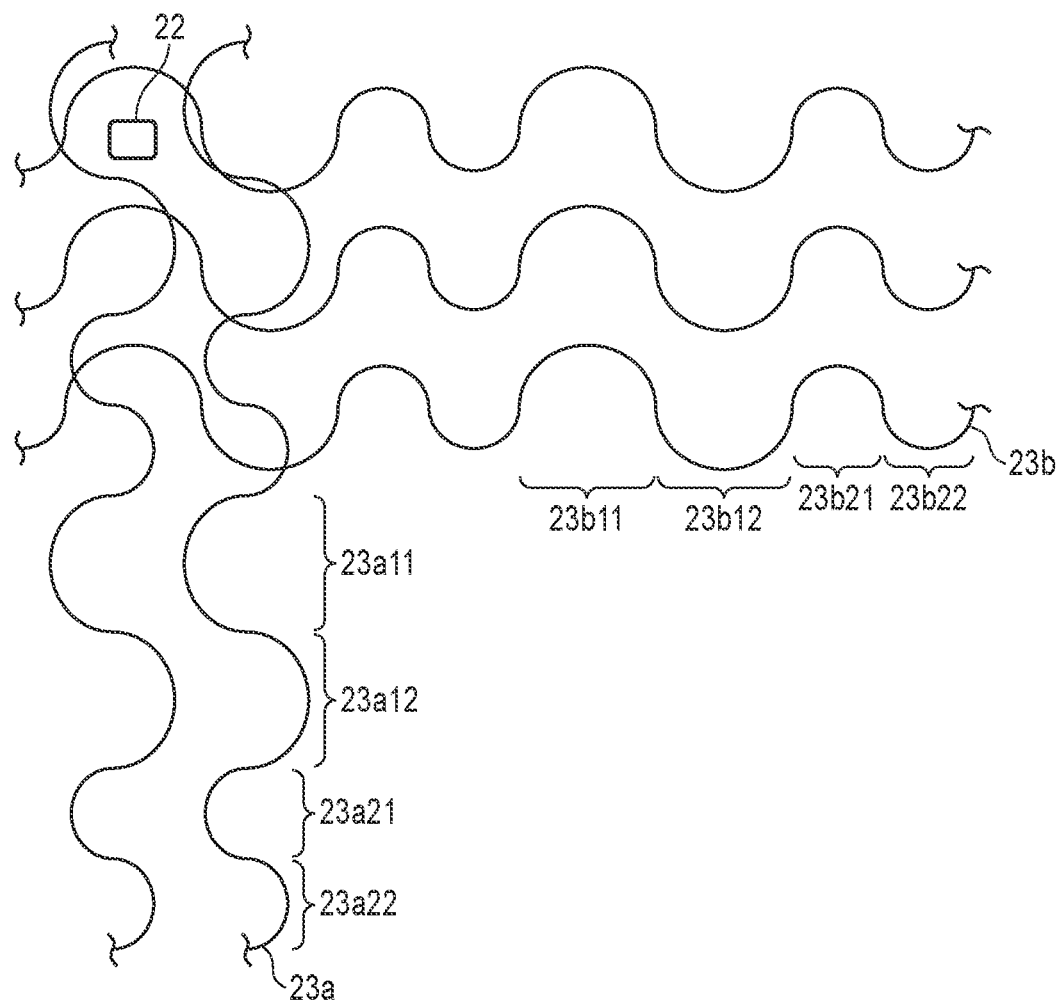
FIG. 12 illustrates another example of the first and second lines of the subpixel.

FIG. 12 is a schematic view of first line 23a and second line 23b of the sub-pixel SP, in which the first line 23a and the second line 23b are composed of arcs with two different radii of curvature.

The first line 23a includes two first semicircular parts 23a11 and 23a12 with the first radius of curvature and two second semicircular parts 23a21 and 23a22 with the second radius of curvature. The first semicircular part includes the first semicircular part 23a11 projecting in the left side of FIG. 12 and the first semicircular part 23a12 projecting in the right side of FIG. 12. The second semicircular part includes the second semicircular part 23a21 projecting in the left side of FIG. 12 and the second semicircular part 23a22 projecting in the right side of FIG. 12. The first radius of curvature is larger than the second radius of curvature.

The second line 23b includes two third semicircular parts 23b11 and 23b12 with a third radius of curvature and two fourth semicircular parts 23b21 and 23b22 with a fourth radius of curvature. The third semicircular part includes the third semicircular part 23b11 projecting in the upper side of FIG. 12 and the third semicircular part 23b12 projecting in the lower side of FIG. 12. The fourth semicircular part includes the fourth semicircular part 23b21 projecting in the upper side of FIG. 12 and the fourth semicircular part 23b22 projecting in the lower side of FIG. 12. The third radius of curvature is larger than the fourth radius of curvature.

Figure 13:
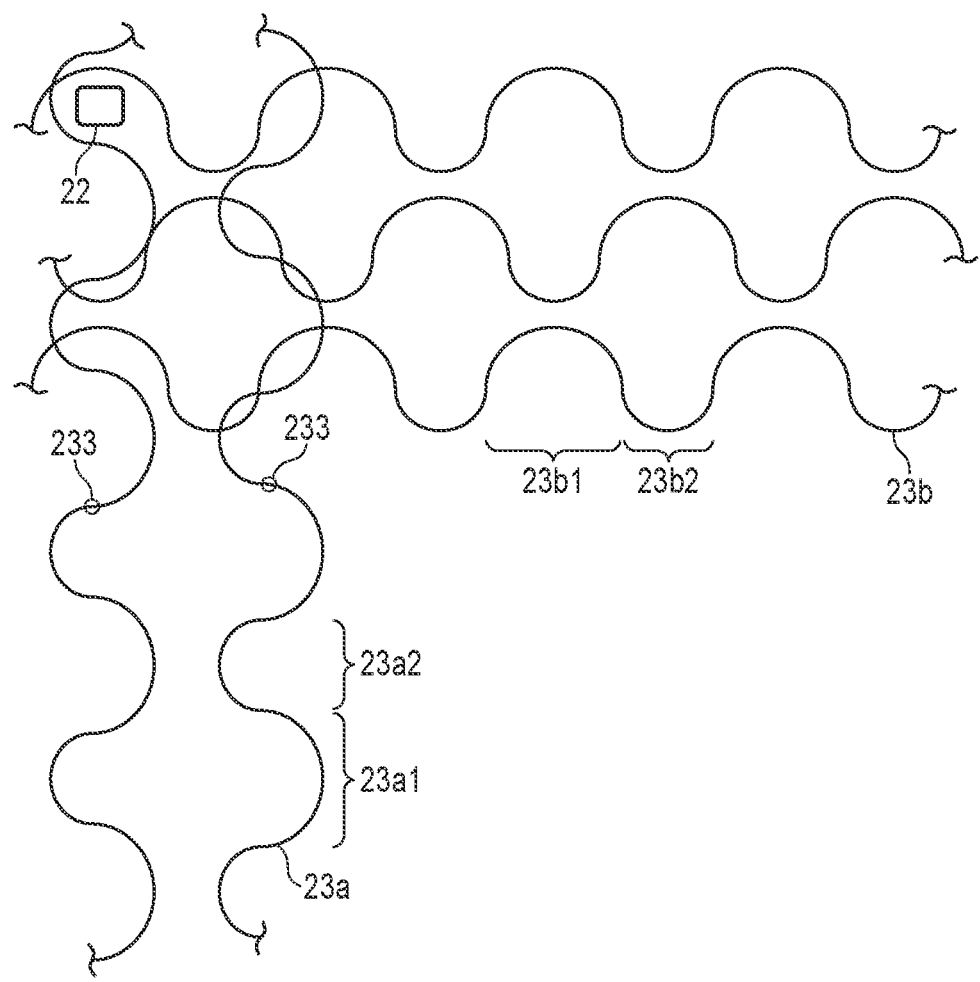
FIG. 13 illustrates another example of the first and second lines of the subpixel.

FIG. 13 is a schematic view of first line 23a and second line 23b of the sub-pixel SP, in which the first line 23a and the second line 23b are composed of arcs with two different radii of curvature as in FIG. 11. Furthermore, the first semicircular part 23a1 and the second semicircular part 23a2 are arranged alternately, with the third semicircular part 23a1 and the fourth semicircular part 23a2 are arranged alternately. In the structure of FIG. 13, the phases of adjacent lines are different. Therefore, between adjacent lines, positions of inflection points 233 are shifted in the direction of line extension.

According to the structure of FIGS. 11 to 13 as described above, in the present embodiment, at least a part of the line having a shape in which a plurality of semicircular parts are continuously connected, the radius of curvature of a certain semicircular part may differ from the radius of curvature of a semicircular part adjacent to the certain semicircular part.

Figure 14:
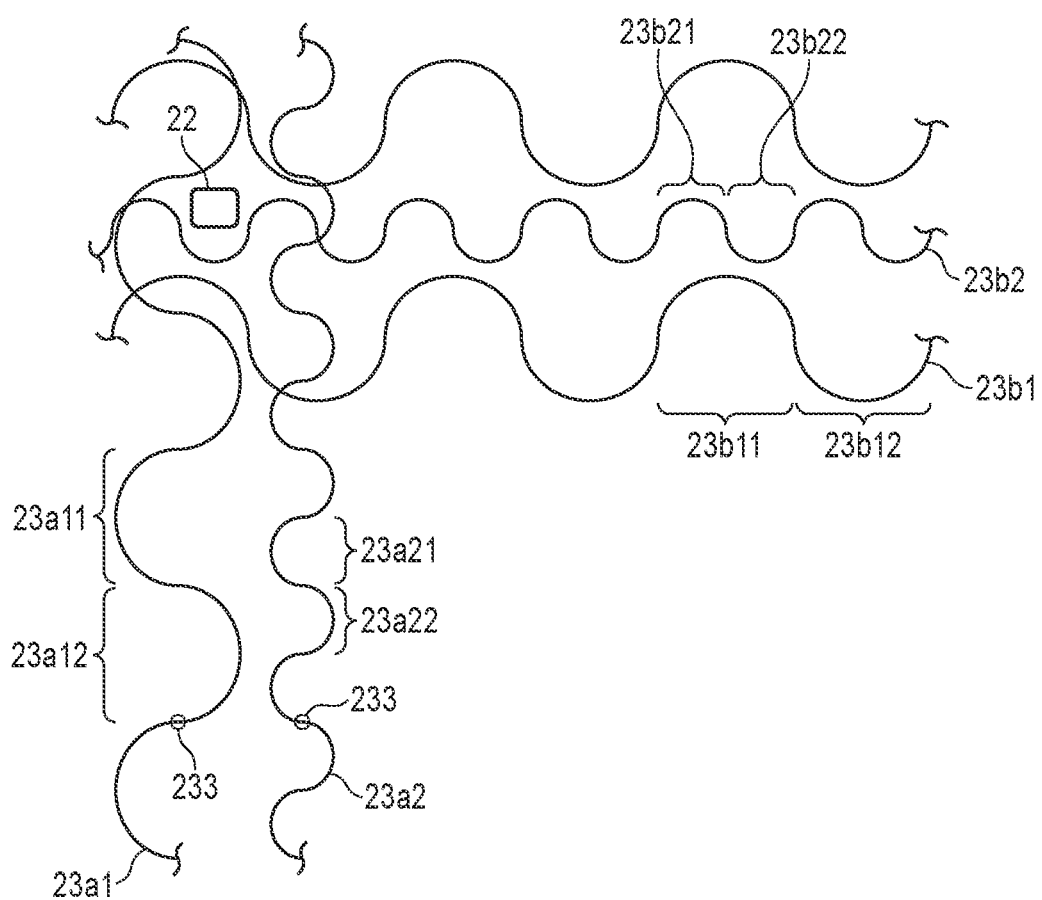
FIG. 14 illustrates another example of the first and second lines of the subpixel.

FIG. 14 is a schematic view of first line 23a and second line 23b of the sub-pixel SP.

The first line 23a includes a first semicircular line 23a1 with a first radius of curvature and a second semicircular line 23a2 with a second radius of curvature.

The first semicircular line 23a1 includes two first semicircular parts 23a11 and 23a12 with a first radius of curvature. The first semicircular part includes the first semicircular part 23a11 projecting in the left side of FIG. 14 and the first semicircular part 23a12 projecting in the right side of FIG. 14.

The second semicircular line 23a2 includes two second semicircular parts 23a21 and 23a22 with a second radius of curvature. The second semicircular part includes the second semicircular part 23a21 projecting in the left side of FIG. 14 and the second semicircular part 23a22 projecting in the right side of FIG. 14. The first radius of curvature is larger than the second radius of curvature.

The second line 23b includes a third semicircular line 23b1 with a third radius of curvature and a fourth semicircular line 23b2 with a fourth radius of curvature.

The third semicircular line 23b1 includes two third semicircular parts 23b11 and 23b12 with a third radius of curvature. The third semicircular part includes the third semicircular part 23b11 projecting in the upper side of FIG. 14 and the third semicircular part 23b12 projecting in the lower side of FIG. 14.

The fourth semicircular line 23b2 includes two fourth semicircular parts 23b21 and 23b22 with a fourth radius of curvature. The fourth semicircular part includes the fourth semicircular part 23b21 projecting in the upper side of FIG. 14 and the fourth semicircular part 23b22 projecting in the lower side of FIG. 14. The third radius of curvature is larger than the fourth radius of curvature. In the structure of FIG. 14, between adjacent lines, positions of inflection points 233 are shifted in the direction of line extension.

As mentioned above, according to the structure of FIG. 14, in the present embodiment, the radius of curvature of a semicircular part of a certain line may differ from the radius of curvature of a semicircular part of a line adjacent to the certain line.

That is, in the structure of FIGS. 11 to 14, the first radius of curvature and the third radius of curvature may be the same, and the second radius of curvature and the fourth radius of curvature may be the same.

By using two or more radii of curvature of the arcs of the lines, the number and size of the slits can be adjusted easily. Furthermore, large pixel circuits can be adopted.

Furthermore, in the electronic apparatus of the embodiment, the camera 6 (visible light camera) which receives visible light and captures a color image is arranged on the back surface of the display device 1; however, an infrared camera having an image capturing element which receives infrared light (infrared) may be arranged on the back surface of the display device 1, or both a visible light camera and an infrared camera may be arranged. In addition, other than the aforementioned visible light camera and the infrared camera, the present embodiment is applicable to an electronic apparatus in which a device with an image capturing element (light receiving element) which receives light through the display device 1 is arranged to overlap with pixels PX.

All electronic apparatuses and display devices, which are implementable with arbitrary changes in design by a person of ordinary skill in the art based on the electronic apparatuses and display devices described above as the embodiments of the present invention, belong to the scope of the present invention as long as they encompass the spirit of the present invention.

Various modifications are easily conceivable within the category of the idea of the present invention by a person of ordinary skill in the art, and these modifications are also considered to belong to the scope of the present invention. For example, additions, deletions or changes in design of the constituent elements or additions, omissions or changes in condition of the processes may be arbitrarily made to the above embodiments by a person of ordinary skill in the art, and these modifications also fall within the scope of the present invention as long as they encompass the spirit of the present invention.

In addition, the other advantages of the aspects described in the above embodiments, which are obvious from the descriptions of the specification or which are arbitrarily conceivable by a person of ordinary skill in the art, are considered to be achievable by the present invention as a matter of course.

What is claimed is:

1. An electronic apparatus comprising:
    a display panel on which a plurality of pixels are arranged and has a display surface and a back surface opposed to the display surface; and
    an image capturing element arranged behind the back surface of the display panel and configured to receive light through the display panel, wherein
    the display panel includes a plurality of lines formed in an area overlapping with the image capturing element and connected to the pixels,
    the image capturing element is arranged overlapping with the pixels and the plurality of lines in a plan view,
    the plurality of lines has a first line extending in a first direction and a second line extending a second direction intersecting the first direction,
    the first line and the second line intersect each other in the plan view,
    the first line is shaped to meander in the plan view,
    the first line includes a first semicircular part having a first radius of curvature and a second semicircular part having a second radius of curvature,
    the first semicircular part is convex to the second direction,
    the second semicircular part is concave to the second direction,
    the first semicircular part and the second semicircular part are connected continuously,
    the second line is shaped to meander in the plan view,
    the second line includes a third semicircular part having the third radius of curvature and a fourth semicircular part having a fourth radius of curvature,
    the third semicircular part is convex to the first direction,
    the fourth semicircular part is concave to the first direction, and
    the third semicircular part and the fourth semicircular part are connected continuously.

2. The electronic apparatus of claim 1, wherein, the first radius of curvature is different from the second radius of curvature.

3. The electronic apparatus of claim 1, wherein
    the first line and the second line are the same shape.

4. The electronic apparatus of claim 1, wherein
each of the pixels includes a light emitting element and a pixel circuit configured to drive the light emitting element,
the second line extends in a second direction and includes first and second scan lines, and
between first and second pixels which are adjacent to each other in the second direction, the first pixel includes a pixel circuit which is connected to the first scan line while the second pixel includes a pixel circuit which is connected to the second scan line.

5. The electronic apparatus of claim 1, wherein each pixel includes a pixel circuit and pixel circuits of pixels which are adjacent in the second direction are shifted in the first direction.

6. The electronic apparatus of claim 1, wherein
the first semicircular part is symmetry with the second semicircular part.

* * * * *